United States Patent
Rybicki et al.

(10) Patent No.: US 7,302,067 B2
(45) Date of Patent: Nov. 27, 2007

(54) AUDIO SYSTEM FOR A COMPUTER

(75) Inventors: Mathew A Rybicki, Austin, TX (US); Nararit Pitakpaivan, Austin, TX (US)

(73) Assignee: Integrated Device Technology, Inc., San Jose, CA (US)

( * ) Notice: Subject to any disclaimer, the term of this patent is extended or adjusted under 35 U.S.C. 154(b) by 0 days.

(21) Appl. No.: 11/014,451

(22) Filed: Dec. 16, 2004

(65) Prior Publication Data
US 2005/0100178 A1    May 12, 2005

Related U.S. Application Data

(63) Continuation of application No. 09/690,215, filed on Oct. 17, 2000, now Pat. No. 6,931,139.

(51) Int. Cl.
*H03G 5/00* (2006.01)

(52) U.S. Cl. .......................................... 381/101; 381/99

(58) Field of Classification Search ................ 381/101, 381/99, 104, 107, 109, 98, 27, 81; 333/28 T
See application file for complete search history.

(56) References Cited

U.S. PATENT DOCUMENTS 3,803,357 A * 4/1974 Sacks ......................... 381/94.8
5,278,909 A * 1/1994 Edgar ............................ 381/22
5,617,478 A * 4/1997 Tagami et al. ................. 381/56

FOREIGN PATENT DOCUMENTS

JP           09182197     * 7/1997

* cited by examiner

*Primary Examiner*—Xu Mei
(74) *Attorney, Agent, or Firm*—Garlick Harrison & Markison; Timothy W. Markison; Bruce E. Stuckman

(57) ABSTRACT

A computer audio system includes an audio codec and a tone controller. The audio codec is operably coupled to receive audio information, which includes tone control settings, PCM digital audio inputs and PCM digital audio outputs. In addition, the audio codec may receive audio information as analog input signals via a line-in, a CD input, or an auxiliary input. Based on the audio information, the audio codec provides a first stereo output, a second stereo output and a monotone audio output. The tone controller is operably coupled to the audio codec and includes a low pass filter, a high pass filter, a band pass filter, and a summing module. The low pass filter is operably coupled to filter the monotone audio output and isolates bass components of the audio signal being processed. By further coupling a volume control module to the low pass filter, the bass component of the audio signal being processed may be varied. The high pass filter is operably coupled to filter the first stereo audio signal to pass treble components of the audio signal being processed. Similarly, a volume control module may be coupled to the high pass filter to provide tone control for the treble components of the audio signal being processed. The band pass filter is operably coupled to filter the second stereo audio output, which passes midband components of the audio signal being processed. Similarly, a volume control module may be coupled to the band pass filter such that midband components of the audio signal being processed may be adjusted. The summing module sums the bass component, treble component and midband component of the audio signal being processed to produce a tone controlled audio output.

6 Claims, 6 Drawing Sheets audio codec 18 audio codec 18 tone controller 20

AUDIO SYSTEM FOR A COMPUTER

This patent application is claiming priority under 35 USC § 120 as a continuing patent application to patent application having a title of A Computer Audio System, a Ser. No. of 09/690,215, and a filing date of Oct. 17, 2000 now U.S. Pat. No. 6,931,139.

TECHNICAL FIELD OF THE INVENTION

This invention relates generally to computers and more particularly to audio processing in computers.

BACKGROUND OF THE INVENTION

As is known, personal computers (PC) and laptop computers include audio processing circuitry. Such audio processing circuitry allows a computer to play CDs, DVDs, etc. and produce audible sound therefrom. Current PCs and laptop computers include three audio jacks to facilitate the processing of audio. The three jacks are typically labeled line-in, microphone, and line-out. The line-in audio jack receives analog audio signals from external devices such as a CD player, cassette player, etc. The audio processing circuitry receives the analog audio signals converts the analog signals into digital signals, which can be manipulated by the computer. The audio processing circuitry also receives digital audio signals from the computer, converts them to analog signals, and provides the analog signals to speakers via the line-out jack. The digital audio signals may also be received via playback of a CD, an internal CD driver, etc. The audio processing circuitry may also receive analog audio signals via the microphone audio jack and convert these analog signals into digital audio signals for processing by the computer.

Typically, a computer will include an audio codec to facilitate the processing of audio signals. As is known, an audio codec receives analog signals and converts them to digital signals and receives digital signals and converts them to analog signals. While the audio codec provides a wide variety of audio processing functions, it does not provide tone control. As is known, tone control allows for the adjusting of amplitudes of analog signals within certain frequency ranges. As is also known, the audio frequency range is generally between 20 Hz to 20 KHz, which may be divided into multiple components. For example, bass component signals are generally signals having frequencies less than 200 Hz and treble component signals are generally signals having frequencies greater than 4 Khz.

To enhance a user enjoyment of computer audio and to compensate for imperfections in low-end speakers' ability to accurately reproduce music, it is desirable to provide tone control. Therefore, a need exists for a computer audio system that provides tone control options.

DETAILED DESCRIPTION OF THE PREFERRED EMBODIMENT

Generally, the present invention provides a computer audio system that includes an audio codec and a tone controller. The audio codec is operably coupled to receive audio information, which includes tone control settings, PCM digital audio inputs and PCM digital audio outputs. In addition, the audio codec may receive audio information as analog input signals via a line-in, a CD input, or an auxiliary input. Based on the audio information, the audio codec provides a first stereo output, a second stereo output and a monotone audio output. The tone controller is operably coupled to the audio codec and includes a low pass filter, a high pass filter, a band pass filter, and a summing module. The low pass filter is operably coupled to filter the monotone audio output and isolates bass components of the audio signal being processed. By further coupling a volume control module to the low pass filter, the bass component of the audio signal being processed may be varied. The high pass filter is operably coupled to filter the first stereo audio signal to pass treble components of the audio signal being processed. Similarly, a volume control module may be coupled to the high pass filter to provide tone control for the treble components of the audio signal being processed. The band pass filter is operably coupled to filter the second stereo audio output, which passes midband components of the audio signal being processed. Similarly, a volume control module may be coupled to the band pass filter such that midband components of the audio signal being processed may be adjusted. The summing module sums the bass component, treble component and midband component of the audio signal being processed to produce a tone controlled audio output. With such a computer audio system, tone control may be readily provided in PCs and laptop computers without the need for expensive equalizing circuitry or other expensive tone control circuits.

Figure 1:
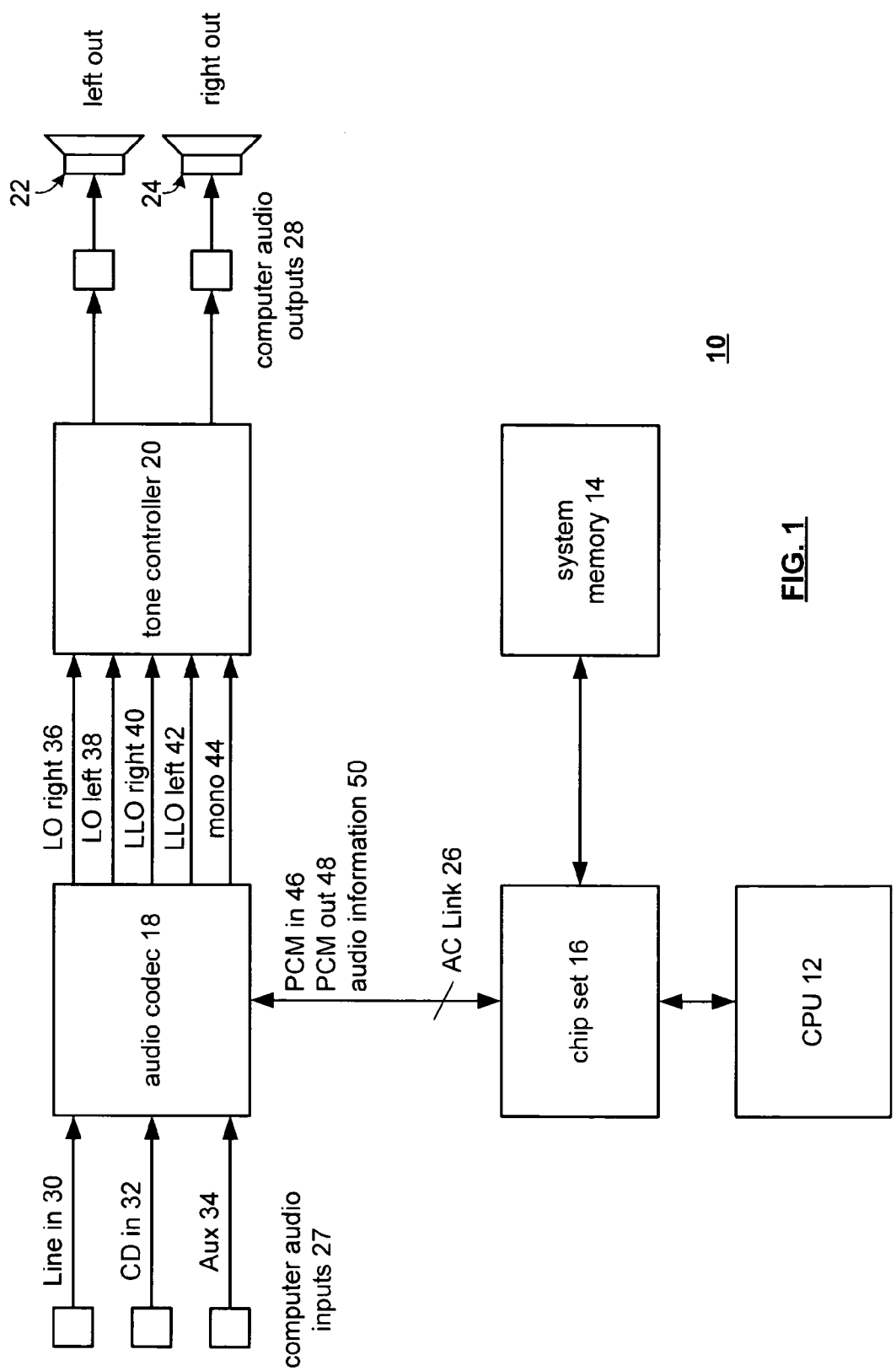
FIG. 1 illustrates a schematic block diagram of a computer audio system in accordance with the present invention.

The present invention can be more fully described with reference to FIGS. 1 through 6. FIG. 1 illustrates a schematic block diagram of the computer audio system 10 that includes a central processing unit (CPU) 12, system memory 14, a chip set 16, an audio codec 18, a tone controller 20, and a pair of speakers 22 and 24. The functionality of a central processing unit 12, the system memory 14, and the chip set 16 is well known thus no further discussion will be presented except to illustrate the present invention. As shown, the chip set 16 communicates with the audio codec 18 via an AC link 26. The information conveyed over the AC link 26 is in accordance with the AC 97 specification Rev. 1.03 and subsequent revisions thereto. In general, the information conveyed over the AC link 26 includes PCM digital audio inputs 46, PCM digital audio outputs 48 and audio information 50. The audio information 50 includes volume settings, multiplexor selection settings, tone control settings (i.e. bass settings, midrange settings, and treble settings) and other control information in accordance with the AC 97 specification.

The audio codec 18 receives computer audio inputs 27 via one or more of a line input 30, a CD input 32 and an auxiliary input 34. As is known, these inputs provide analog audio signals to the audio codec 18. The audio codec 18, which may be a STAC9721 manufactured and distributed by SigmaTel, Inc., manipulates the analog signals, analog audio signals and/or digital audio signals to produce two stereo outputs and a monotone output 44. The first stereo output may be the line-out, which includes a line-out right channel 36 and a line-out left channel 38. The second stereo output may be a line-level output that includes a line-level out right channel 40 and a line-level out left channel 42. The tone controller 20 is operably coupled to receive the line-out right and left channels 36 and 38, the line-level out left and right channels 40 and 42 and the monotone channel 44. Based on these inputs, the tone controller 20 produces a tone controlled stereo output that is provided to the computer audio outputs 28. The computer audio output may be the line-out audio jack of a PC or laptop computer. Alternatively, the computer audio output 28 may be provided directly to speakers 22 and 24 that are included in the PC or laptop.

Figure 2:
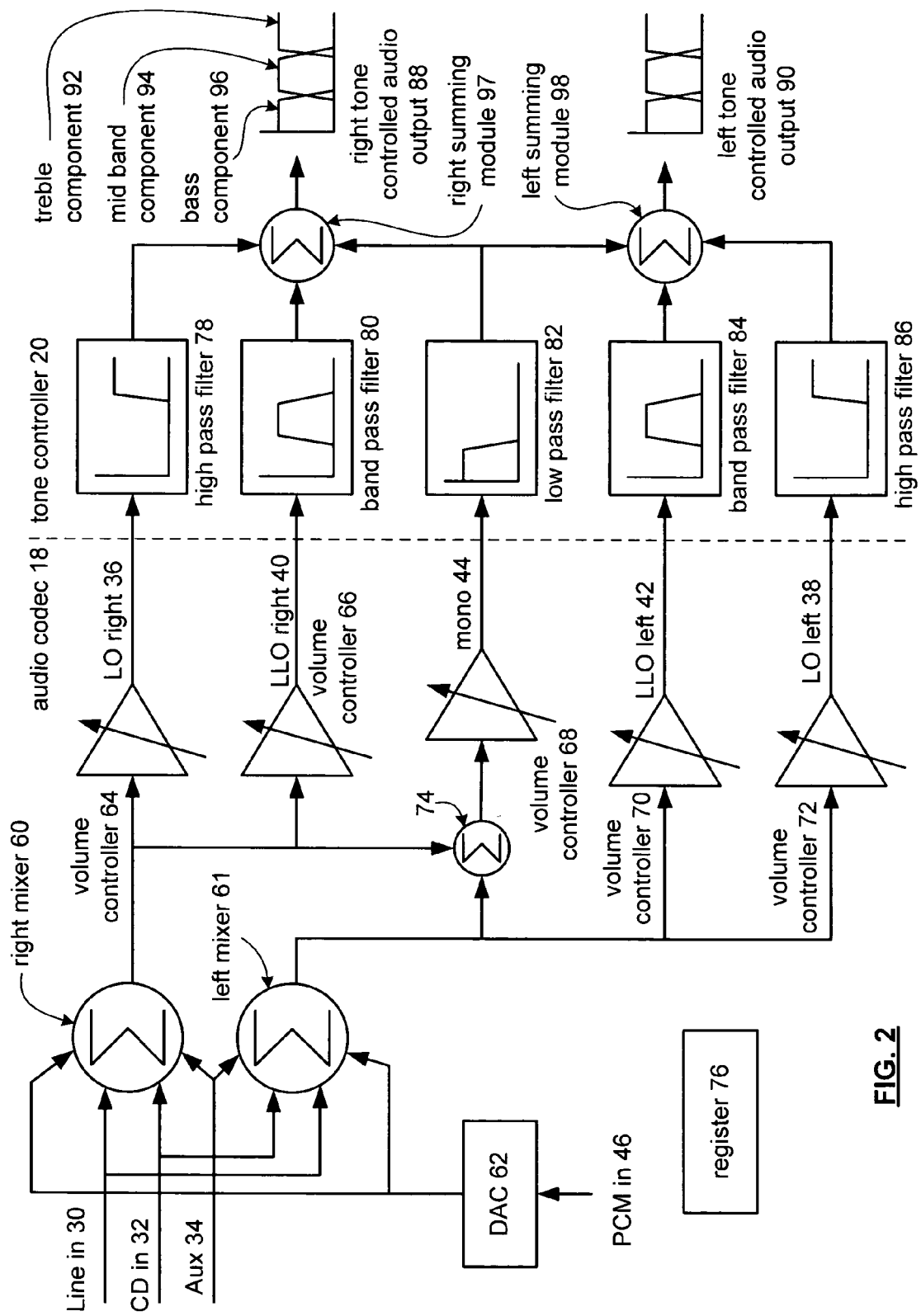
FIG. 2 illustrates a more detailed schematic block diagram of the audio codec and tone controller of the computer audio system of FIG. 1.

FIG. 2 illustrates a more detailed schematic block diagram of the audio codec 18 and tone controller 20. As shown, the audio codec 18 includes a right mixer 60, a left mixer 61, a digital to analog converter 62, a plurality of volume controller 64, 66, 68, 70 and 72, a summing module 74, and a register 76. The register 76 is operably coupled to receive the audio information 50 via the AC link 26. Such audio information 50 may include volume settings for each of the volume controllers 64 through 72, bass tone settings, treble tone settings, mid component tone settings, etc.

The digital to analog converter 62 is operably coupled to receive the PCM digital audio input 46 and convert the digital audio signal into an analog audio signal. The right and left mixers 60 and 61 are operably coupled to mix one or more of the line input 30, CD input 32, auxiliary input 34 or the output of DAC 62. The output of the right mixer 60 is provided to volume controller 64, volume controller 66, and the summing module 74. The volume controller 64 provides volume control for the line-out right channel 36, while volume control of 66 provides volume control for the line-level output right channel 40. The output of mixer 61 is provided to the summing module 74, the volume controller 70 and the volume controller 72. The volume controller 70 controls the volume for the line-level output of the left channel 42 and volume controller 72 provides the volume control for the line-out left channel 38. The summing module 74 sums the output of the right channel mixer 60 with the output of the left channel mixer 61 to produce a monotone signal. Volume controller 68 controls the volume for the monotone output 44.

The tone controller 20 includes a high pass filter 78 (which may have a corner frequency of 1-4 KHz), a band pass filter 80 (which may have corner frequencies of 100 Hz and 1-4 KHz), a low pass filter 82 (which may have a corner frequency of 100 Hz), a band pass filter 84 (which may have corner frequencies of 100 Hz and 1-4 KHz), a high pass filter 86 (which may have a corner frequency of 1-4 KHz), a right summing module 97 and a left summing module 98. The low pass filter 82 is operably coupled to receive the output of the volume controller 68 and thus filters the monotone signal 44. As such, only the bass component of the monotone signal is provided. As is generally known, bass signals are typically monotone in audio recordings. High pass filter 78 is operably coupled to filter the line-out right channel 36 such that only the treble components associated with the line-out right channel 36 are passed. Band pass filter 80 is operably coupled to receive the line-level output right channel 40 and pass the mid-components of the line-level right channel out 40. The right summing module 97 receives the output of high pass filters 78, band pass filter 80, and low pass filter 82 to produce a right tone controlled audio output 88. As shown, the right tone controlled audio output 88 includes a bass component 96, a mid-band component 94, and a treble component 92.

The band pass filter 84 is operably coupled to receive the line-level out left channel 42 and pass only the mid-band components associated therewith. The high pass filter 86 is operably coupled to receive the line-out left channel 38 and pass the treble components thereof. The left summing module 98 is operably coupled to receive the output of low pass filter 82, band pass filter 84 and high pass filter 86 to produce a left tone controlled audio output 90. The left tone controlled audio output 90 also includes a treble component, a mid-band component and a bass component. As such, by adjusting the volume settings for volume controllers 64 through 72, tone control may be readily provided in a computer environment with minimal additional circuitry and minimal additional expense. As one of average skill in the art will appreciate, the band pass filters 80 and 84 may be deleted such that all frequency components are presented to the summing nodes 97 and 98.

Figure 3:
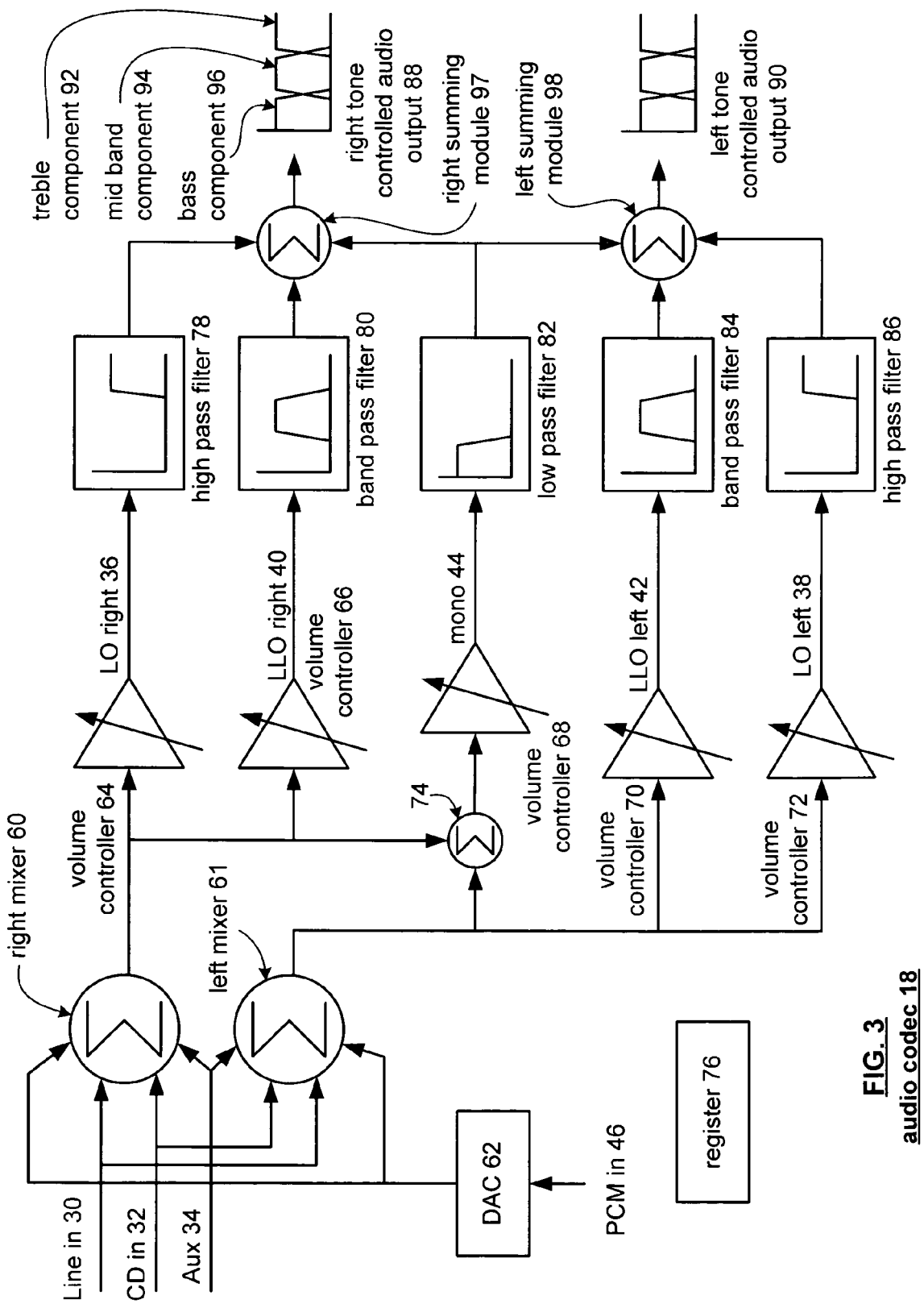
FIG. 3 illustrates a schematic block diagram of an audio codec including tone control functionality in accordance with the present invention.

FIG. 3 illustrates an audio codec that includes at least portions of the tone control functionality as separate components or as part of the audio processing circuitry. The audio codec includes the right and left mixers 60 and 61, the digital to analog converter 62, the volume controller 64 through 72, the semi-module 74, register 76 and tone control circuitry. The tone control circuitry includes the high pass filter 78, the band pass filter 80, the low pass filter 82, the band pass filter 84, the high pass filter 86, the right summing module 97 and the left summing module 98. The functionality of the audio codec 18 including the tone control circuitry functions in a similar manner to the circuit of FIG. 2. The primary difference between the circuit of FIG. 3 and the circuit of FIG. 2, is that the audio codec 18 of FIG. 3 includes the tone control circuitry. An advantage of the audio codec of FIG. 3 is that sound card manufactures and motherboard manufacturers would not need to include the additional circuitry associated with the tone controller 20.

Figure 4:
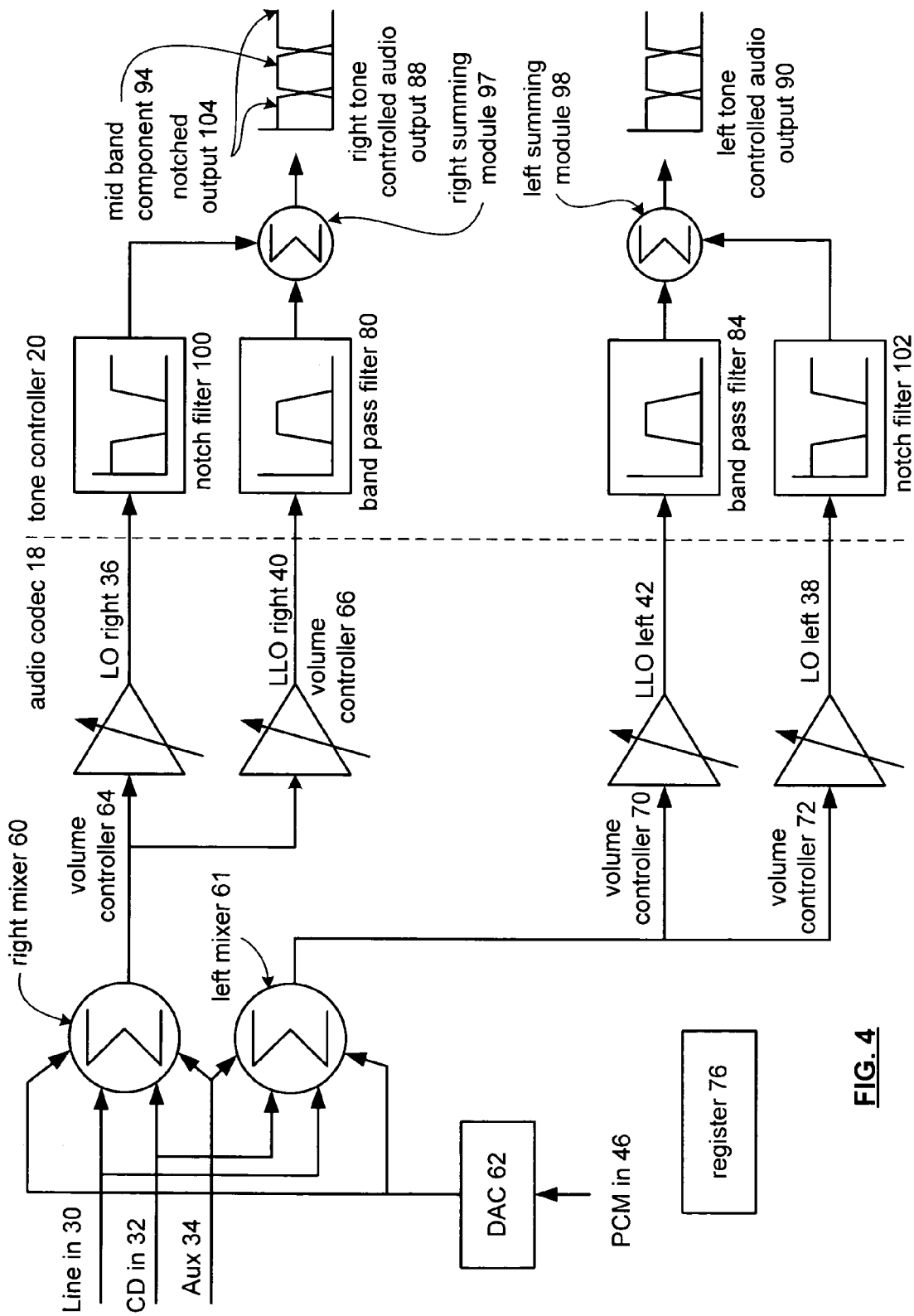
FIG. 4 illustrates an alternate detailed schematic block diagram of the audio codec and tone controller of FIG. 1.

FIG. 4 illustrates a schematic block diagram of an alternate coupling of the audio codec 18 with tone controller 20. In this embodiment, the audio codec 18 does not include a monotone output. As such, the audio codec produces a line-out right audio signal 36, a line-level out right audio signal 40, a line-level out left audio signal 42 and a line-out left audio signal 38. The adjusting of the volume controller 64, 66, 70 and 72 will be controlled via data stored in register 76 as previously discussed.

The tone controller 20 includes a notch filter 100, band pass filter 80, band pass filter 84, notch filter 102, right summing module 97 and left summing module 98. The band pass filter 80 passes mid-band components of the line-level out right channel 40 to the right summing module 97. The notch filter 100 passes bass components and treble components of the line-out right channel 36 to the right summing module 97. The right summing module sums the output of the notch filter 100 and the band pass filter 80 to produce the right tone controlled audio output 88. In this embodiment, the volume setting for volume controller 64 controls the notched output 104 as such, the bass and treble components of the right toned controlled audio output will be set using the same volume inputs.

The band pass filter 84 passes the mid-band components of the line-level out left channel 42 to the left summing module 98. The notch filter 102 passes the bass components and treble components of the line-out left channel 38 to the left summing module 98. The left summing module 98 sums the outputs of band pass filter 84 and notch filter 102 to produce the left tone controlled audio output 90.

Figure 5:
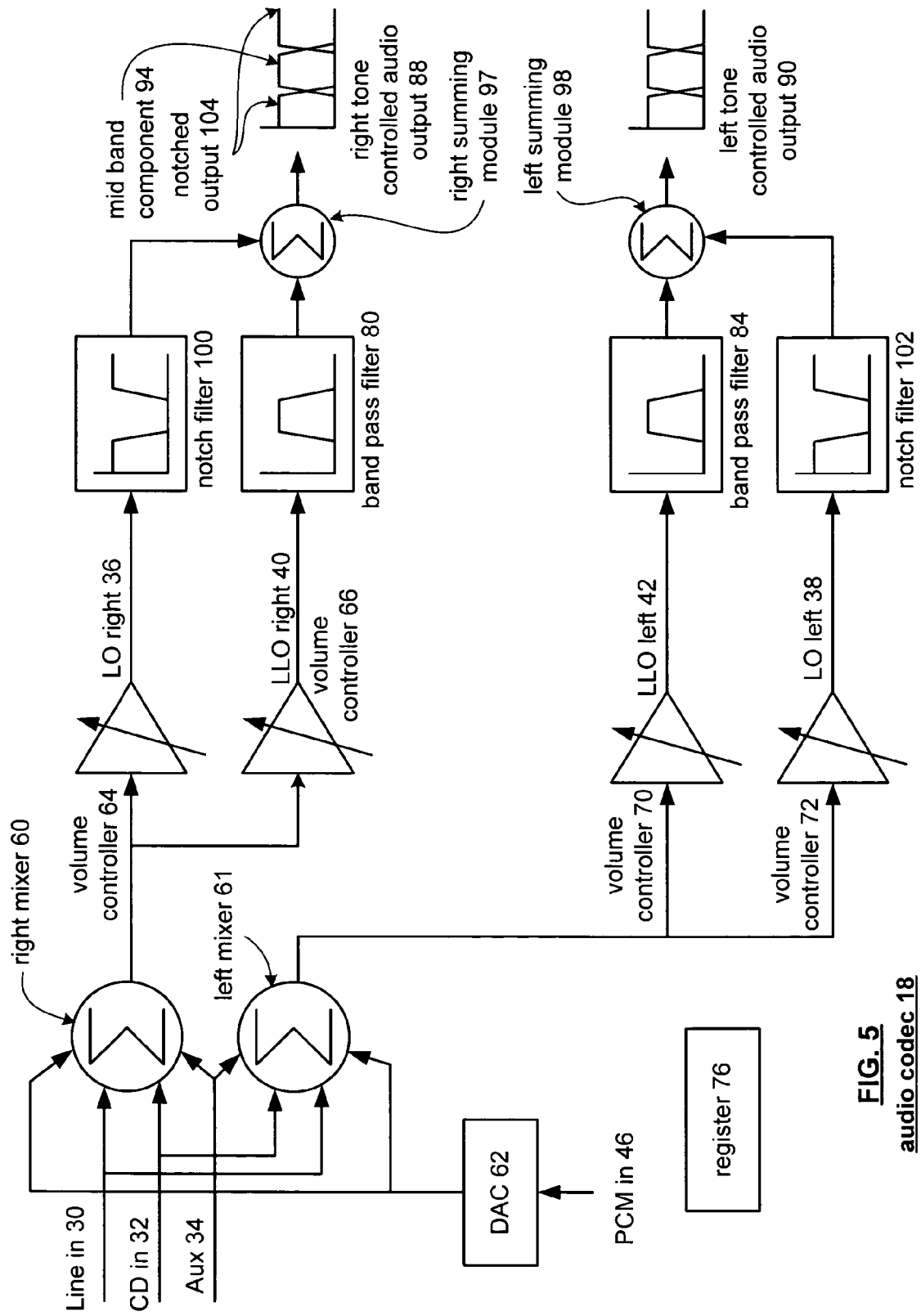
FIG. 5 illustrates an alternate schematic block diagram of an audio codec including tone control functionality in accordance with the present invention.

FIG. 5 illustrates the audio codec 18 including the right mixer 60, left mixer 61, DAC 62, volume controllers 64, 66, 70 and 72, register 76 and tone control circuitry. The tone control circuitry includes notch filter 100, band pass filter 80, band pass filter 84, notch filter 102, right summing module 97 and left summing module 98. The functionality of the audio codec 18 of FIG. 5 that includes the tone control functionality, operates in a similar manner as the circuit described with reference to FIG. 4.

Figure 6:
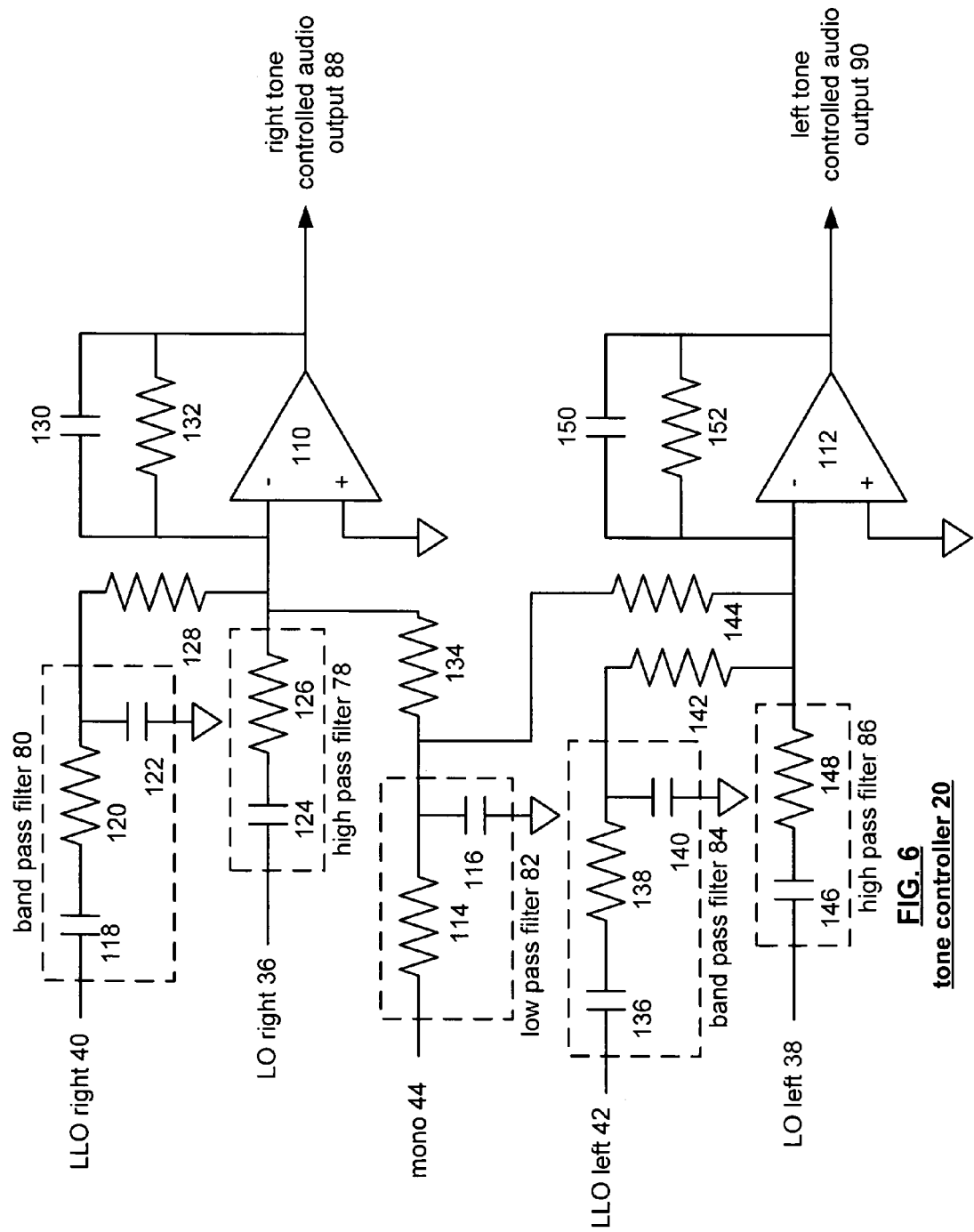
FIG. 6 illustrates a schematic block diagram of the tone controller functionality in accordance with the present invention.

FIG. 6 illustrates a schematic block diagram of the tone controller functionality 20. As shown, band pass filter 80 includes capacitors 118 and 122 and a resistor 120. As coupled, the band pass filter 80 passes mid-band components of the line-level out right channel 40 via resistor 128 to the negative input of operational amplifier 110. The negative input of operation amplifier 110 functions as the right summing module 97. The operational amplifier 110 includes feedback components 130 and 132.

The high pass filter 78 includes capacitor 124 and resistor 126. As coupled, the components of the high pass filter 78 pass the treble components of the line-out right channel 36 to the negative input of operational amplifier 110. The low pass filter 82 includes resistor 114 and capacitor 116. As coupled, the components of low pass filter 82 pass the low frequency components of the monotone signal 44 to the negative input of operational amplifier 110 via resistor 134. As one of average skill in the art will appreciate, the capacitor and resistor values of the filters 80, 78 and 82 will be sized to pass the appropriate frequency ranges of bass signal components, mid-band signal components and treble components of audio signals.

The band pass filter 84 includes capacitors 136, 140 and resistor 138. As coupled, the components of band pass filter 84 pass the mid-band components of the line-level out left channel 42 to the negative input of operational amplifier 112 via resistor 142. High pass filter 86 includes capacitor 146 and resistor 148. The components of the high pass filter 86 pass the treble components of the line-out left channel 38 to the negative input of operational amplifier 112. The negative input of operational amplifier 112 is also operably coupled via resistor 144 to the output of low pass filter 82. The operational amplifier 112 includes feedback components 150 and 152 to produce the left tone controlled audio output 90.

The preceding discussion has presented a computer audio system that provides tone control with minimal additional circuitry and minimal additional costs. As such, as computer features enhance, the present invention provides enhanced audio enjoyment for users of computers with minimal additional cost to computer manufacturers. As one of average skill in the art will appreciate, other embodiments may be derived from the teachings contained herein without deviating from the scopes of the claims. For example, additional filters may be included, where the filters pass different frequency components of the audio signal. As a further example, the filters may have a customized frequency response (e.g., nulls and/or peaks) to compensate for the environment in which the speakers reside and/or the quality of the speakers. Still further, the summing modules 97 and 98 may be implemented on chip with the audio codec while the filters would be off-chip components.

What is claimed is:

1. A computer audio system comprises:
    an audio codec operably coupled to receive audio information and to provide a first stereo audio output, a second stereo audio output, and a monotone audio output based on the audio information; and
    a tone controller operably coupled to the audio codec, wherein the tone controller includes:
        a low pass filter operably coupled to filter the monotone audio output, wherein the low pass filter passes a bass component of the monotone audio output substantially unattenuated and attenuates higher frequency components of the monotone audio output;
        a high pass filter operably coupled to filter the first stereo audio output, wherein the high passes filter passes a treble component of the first stereo audio output substantially unattenuated and attenuates lower frequency components of the first stereo audio signal;
        a band pass filter operably coupled to filter the second stereo audio output, wherein the band pass filter passes a mid band component of the second audio output substantially unattenuated and attenuates low frequency components and high frequency components of the second stereo audio signal; and
        a summing module operably coupled to sum the bass component, the treble component, and the mid band component to produce a tone controlled audio output.

2. The computer audio system of claim 1, wherein at least one of the low pass filter, the high pass filter, and the band pass filter further comprise a frequency response customized based on parameters of a computer including the computer audio system.

3. The computer audio system of claim 1, wherein the summing module further comprises an operational amplifier having a first input, a second input, and an output, wherein the first input is operably coupled to a reference voltage and the second input is operably coupled to sum the bass component, the treble component, and the mid band component.

4. A computer audio system comprises:
    an audio codec operably coupled to receive audio information and to provide a first stereo audio output and a second stereo audio output based on the audio information;
    a tone controller operably coupled to the audio codec, wherein the tone controller includes:
        a notch filter operably coupled to filter the first stereo audio output, wherein the notch filter passes a bass component and a treble component of the first stereo audio output and attenuates a mid-band component of the first stereo audio output to produce a notched audio output;
        a band pass filter operably coupled to filter the second stereo audio output, wherein the band pass filter passes a mid-band component of the second stereo audio output and attenuates a bass component and a treble component of the second stereo audio output to produce a band pass audio output; and a summing module operably coupled to sum the notched audio output and the band pass audio output to produce a tone controlled audio output.

5. The computer audio system of claim 4, wherein at least one of the notch filter and the band pass filter further comprise a frequency response customized based on parameters of a computer including the computer audio system.

6. The computer audio system of claim 4, wherein the summing module further comprises an operational amplifier having a first input, a second input, and an output,
wherein the first input is operably coupled to a reference voltage and the second input is operably coupled to sum the bass component, the treble component, and the mid band component.

* * * * *

UNITED STATES PATENT AND TRADEMARK OFFICE
CERTIFICATE OF CORRECTION

PATENT NO. : 7,302,067 B2
APPLICATION NO. : 11/014451
DATED : November 27, 2007
INVENTOR(S) : Mathew A. Rybicki et al.

Page 1 of 1

It is certified that error appears in the above-identified patent and that said Letters Patent is hereby corrected as shown below:

Column 1, line 4: replace "continuing patent application to patent application" to --continuing patent application to co-pending patent application--.

Signed and Sealed this

Seventeenth Day of February, 2009

JOHN DOLL
*Acting Director of the United States Patent and Trademark Office*